US008269257B2

(12) United States Patent
Gradečak et al.

(10) Patent No.: US 8,269,257 B2
(45) Date of Patent: Sep. 18, 2012

(54) NANOWIRE SYNTHESIS

(75) Inventors: Silvija Gradečak, Cambridge, MA (US); Chun-Hao Tseng, Taichung (TW); Michael Joseph Tambe, Quincy, MA (US); Matthew John Smith, Hampden, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 163 days.

(21) Appl. No.: 12/511,648

(22) Filed: Jul. 29, 2009

(65) Prior Publication Data
US 2011/0024718 A1 Feb. 3, 2011

(51) Int. Cl.
*H01L 21/02* (2006.01)

(52) U.S. Cl. .............. 257/200; 257/9; 257/E23.023; 257/E29.089

(58) Field of Classification Search .......... 257/9, 200, 257/E29.07, E29.089, E21.295, E33.023; 438/584
See application file for complete search history.

(56) References Cited

U.S. PATENT DOCUMENTS

| | | | | |
|---|---|---|---|---|
| 2003/0089899 | A1* | 5/2003 | Lieber et al. | 257/9 |
| 2004/0150311 | A1* | 8/2004 | Jin | 313/309 |
| 2005/0082543 | A1* | 4/2005 | Alizadeh et al. | 257/79 |
| 2005/0164432 | A1* | 7/2005 | Lieber et al. | 438/149 |
| 2007/0111460 | A1* | 5/2007 | Mosley et al. | 438/381 |
| 2009/0233236 | A1* | 9/2009 | Black et al. | 430/311 |

OTHER PUBLICATIONS

Carraro et al. (Metallization and Nan structuring of semiconductor surfaces by galvanic displacement processes • Review article Surface Science Reports, vol. 62, Issue 12, Dec. 2007, pp. 499-525).*

Aizawa, M. & Buriak, J. M., Block copolymer templated chemistry for the formation of metallic nanoparticle arrays on semiconductor surfaces. *Chemistry of Materials* 19, 5090-5101 (2007).
Aizawa, M. & Buriak, J. M., Block copolymer-templated chemistry on Si, Ge, InP, and GaAs surfaces. *J. Am. Chem. Soc.* 127, 8932-8933 (2005).
Bryllert, T., Wernersson, L. E., Fröberg, L. E. & Samuelson, L., Vertical high-mobility wrap-gated InAs nanowire transistor. *IEEE Electron Device Lett.* 27, 323-325 (2006).
Cui, Y., Duan, X., Hu, J. & Lieber, C. M., Doping and electrical transport in silicon nanowires. *J. Phys. Chem. B* 104, 5213-5216 (2000).
Cui, Y., Lauhon, L. J., Gudiksen, M. S., Wang, J. F. & Lieber, C. M., Diameter-controlled synthesis of single-crystal silicon nanowires. *Applied Physics Letters* 78, 2214-2216 (2001).
Duan, X. F., Huang, Y., Cui, Y., Wang, J. F. & Lieber, C. M., Indium phosphide nanowires as building blocks for nanoscale electronic and optoelectronic devices. *Nature* 409, 66-69 (2001).
Duan, X., Huang, Y., Agarwal, R. & Lieber, C. M., Single-nanowire electrically driven lasers. *Nature* 421, 241-245 (2003).
Gao, D. et al., Selective growth of Si nanowire arrays via galvanic displacement processes in water-in-oil microemulsions. *J. Am. Chem. Soc.* 127, 4574-4575 (2005).

(Continued)

*Primary Examiner* — Jarrett Stark
(74) *Attorney, Agent, or Firm* — Steptoe & Johnson LLP

(57) ABSTRACT

A noble metal nanoparticle can be grown on a semiconductor substrate by contacting a predetermined region of the substrate with a solution including noble metal ions. The predetermined region of the semiconductor substrate can be exposed by applying a polymeric layer over the substrate selectively removing a portion of the polymeric layer. The nanoparticles can be prepared in a predetermined pattern. Nanowires having a predetermined diameter and a predetermined position can be grown from the nanoparticles.

14 Claims, 8 Drawing Sheets

OTHER PUBLICATIONS

Gradecak, S., Qian, F., Li, Y., Park, H. G. & Lieber, C. M., GaN nanowire lasers with low lasing thresholds. *Applied Physics Letters* 87 (2005).

Hang, Q. L., Hill, D. A. & Bernstein, G. H., Efficient removers for poly(methylmethacrylate). *Journal of Vacuum Science & Technology B* 21, 91-97 (2003).

Huang, M. H. et al., Room-temparature ultraviolet nanowire nanolasers. *Science* 292, 1897-1899 (2001).

Kraus, T. et al., Nanoparticle printing with single-particle resolution. *Nature Nanotech.* 2, 570-576 (2007).

Law, M., Greene, L. O., Johnson, J. C., Saykally, R. & Yang, P., Nanowire dye-sensitized solar cells. *Nature Mater.* 4, 455-459 (2005).

Li, Y. et al., Dopant-free GaN/AlN/AlGaN radial nanowire heterostructures as high electron mobility transistors. *Nano Lett.* 6, 1468-1473 (2006).

Liao, J., Bernard, L., Langer, M., Schönenberger, C. & Calame, M., Reversible formation of molecular junctions in 2D nanoparticle arrays. *Adv. Mater.* 18, 2444-2447 (2006).

Magagnin, L., Manboudian, R. & Carraro, C., Selective deposition of thin copper films onto silicon with improved adhesion. *Electrochem. Solid-State Lett.* 4, C5-C7 (2001).

Maier, S. A., et al., Plasmonics—a route to nanoscale optical devices. *Adv. Mater.* 13, 1501-1505 (2001).

Mårtensson, T., Borgström, M., Seifert, W., Ohlsson, B. J. & Samuelson, L., Fabrication of individually seeded nanowire arrays by vapour-liquid-solid growth. *Nanotechnology* 14, 1255-1258 (2003).

Mikkelsen, A. et al., The influence of lysine on InP(001) surface ordering and nanowire growth. *Nanotechnology* 16, 2354-2359 (2005).

Nezhad, M. R. H., Aizawa, M., Porter, L. A., Ribbe, A. E. & Buriak, J. M., Synthesis and patterning of gold nanostructures on InP and GaAs via galvanic displacement. *Small* 1, 1076-1081 (2005).

Nguyen, P., Ng, H. T. & Meyyappan, M., Catalyst metal selection for synthesis of inorganic nanowires. *Adv. Mater.* 17, 1773-1777 (2005).

Oskam, G., Long, J. G., Natarajan, A. & Searson, P. C., Electrochemical deposition of metals onto silicon. *Journal of Physics D-Applied Physics* 31, 1927-1949 (1998).

Qian, F. et al., Gallium nitride-based nanowire radial heterostructures for nanophotonics. *Nano Letters* 4, 1975-1979 (2004).

Qian, F. et al., Multi-quantum-well nanowire heterostructures for wavelength-controlled lasers. *Nature Mater.* 7, 701-706 (2008).

Qian, F., Gradecak, S., Li, Y., Wen, C. Y. & Lieber, C. M., Core/multishell nanowire heterostructures as multicolor, high-efficiency light-emitting diodes. *Nano Lett.* 5, 2287-2291 (2005).

Sayed, S. Y., Daly, B. & Buriak, J. M., Characterization of the interface of gold and silver nanostructures on InP and GaAs synthesized via galvanic displacement. *J. Phys. Chem. C* 112, 12291-12298 (2008).

Schmid, H. et al., Patterned epitaxial vapor-liquid-solid growth of silicon nanowires on Si(111) using silane. *Journal of Applied Physics* 103, 024304(024301-024307) (2008).

Song, J. S. et al., Wet chemical cleaning process of GaAs substrate for ready-to-use. *Journal of Crystal Growth* 264, 98-103 (2004).

Song, Y. Y., Gao, Z. D., Kelly, J. J. & Xia, X. H., Galvanic deposition of nanostructured noble-metal films on silicon. *Electrochemical and Solid State Letters* 8, C148-C150 (2005).

Sun, Y. G. & Wiederrecht, G. P., Surfactantless synthesis of silver nanoplates and their application in SERS. *Small* 3, 1964-1975 (2007).

Tian, B. et al., Coaxial silicon nanowires as solar cells and nanoelectronic power sources. *Nature*, 885-890 (2007).

\* cited by examiner

NANOWIRE SYNTHESIS

TECHNICAL FIELD

The present invention relates to nanoparticles and methods of making them.

BACKGROUND

Nanoparticles can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Colloidal gold nanoparticles, are a suspension (or colloid) of sub-micrometer-sized particles of gold in a fluid, usually water. The nanoparticles can have a variety of shapes, including spheres, rods, cubes, and other shapes. Generally, gold nanoparticles are produced in a liquid by reduction of chloroauric acid, $HAuCl_4$. Galvanic reactions where a substrate acts as the reducing agent can produce colloidal Au nanoparticles that can be well controlled for size, but generally with little or no control over nanoparticle location on a substrate.

Bulk synthesis of semiconductor nanowires can be achieved using several variations of transition metal catalyzed techniques such as vapor-liquid-solid (VLS) synthesis. In standard VLS synthesis a nanowire grows from a single particle of a metallic catalyst, e.g., gold, cobalt, nickel or other metal. Nanowire precursors are then exposed to the catalyst particles. Typically this occurs at elevated temperatures, where the precursors are in the gas phase.

SUMMARY

In one aspect, a method of growing a nanowire includes growing a nanowire from a noble metal nanoparticle positioned on a predetermined region of a semiconductor substrate, the noble metal nanoparticle being separated from another nanoparticle on the substrate by a barrier.

The method can include various features. For example, the method can include an amorphous layer surrounding the nanoparticle. In certain embodiments, the barrier is a portion of a substrate that is raised relative to the region of the substrate upon which the nanoparticle is positioned. In certain embodiments, the nanoparticle is positioned in a pit on the substrate. In certain embodiments, the substrate is GaAs. In certain embodiments, the method can further include before growing the nanowire, exposing the predetermined region of the semiconductor substrate, wherein exposing includes applying a polymeric layer over the semiconductor substrate, and selectively removing a portion of the polymeric layer. In certain embodiments, the polymeric layer is a PMMA layer. In certain embodiments, the noble metal is Au. In certain embodiments, the nanoparticle is a nanocrystal. In certain embodiments, the method can further include before growing the nanowire, contacting a predetermined region of the semiconductor substrate with a solution including noble metal ions, wherein contacting includes selecting conditions for a galvanic reaction between the semiconductor substrate and the noble metal ions, thereby forming the noble metal nanoparticle. In certain embodiments, exposing the predetermined region of the substrate includes e-beam lithography. In certain embodiments, the average diameter of the nanoparticle is 25 nm or smaller, or of 10 nm or smaller. In certain embodiments, the average diameter of the nanowire is 25 nm or smaller, or 10 nm or smaller. In certain embodiments, selectively removing a portion of the polymeric layer includes forming a pattern. The pattern can be an array of openings. The openings can have a dimension of 1 nm or less, 5 nm or less, 10 nm or less, 25 nm or less, or a larger dimension. In certain embodiments, growing the nanowires includes metalorganic chemical vapor deposition.

In another aspect, a composition includes a plurality of nanowires each epitaxially grown from a nanoparticle on a surface of a substrate, wherein the plurality of nanowires have a predetermined diameter and a predetermined position.

The composition can include various features. For example, the plurality of nanowires can be separated from another nanowire on the substrate by a barrier. The barrier can include a polymeric material. In certain embodiments, the barrier is a portion of the substrate that is raised relative to the region of the substrate upon which the nanowire is positioned. In certain embodiments, the nanoparticle is positioned in a pit on the substrate. In certain embodiments, the substrate is GaAs. In certain embodiments, the polymeric material is PMMA. In certain embodiments, the nanowire is a GaAs nanowire. In certain embodiments, the nanoparticle is an Au nanoparticle. In certain embodiments, the average diameter of the nanowire is 25 nm or smaller, or 10 nm or smaller.

In another aspect, a nanomaterial includes a nanowire epitaxially grown from a nanoparticle on a surface of a substrate, an amorphous layer surrounding the nanoparticle, and a barrier wherein the barrier is a portion of the substrate that is raised relative to the region of the substrate upon which the nanowire is positioned. The nanomaterial can include various features. For example, the nanoparticle can be a nanocrystal. In certain embodiments, the nanoparticle is an Au nanoparticle. In certain embodiments, the nanowire is a GaAs nanowire. In certain embodiments, the average diameter of the nanowire is 25 nm or smaller, or of 10 nm or smaller. In certain embodiments, the amorphous layer includes an oxide. In certain embodiments, the amorphous layer includes an oxide derived from the substrate.

The details of one or more embodiments are set forth in the accompanying drawings and description below. Other features, objects, and advantages will be apparent from the description and drawings.

DESCRIPTION OF DRAWINGS

FIGS. 1A-1F illustrate results obtained with unpatterned substrates.

Inset is a higher magnification image. All samples are shown after lift-off processes.

Figure 3:
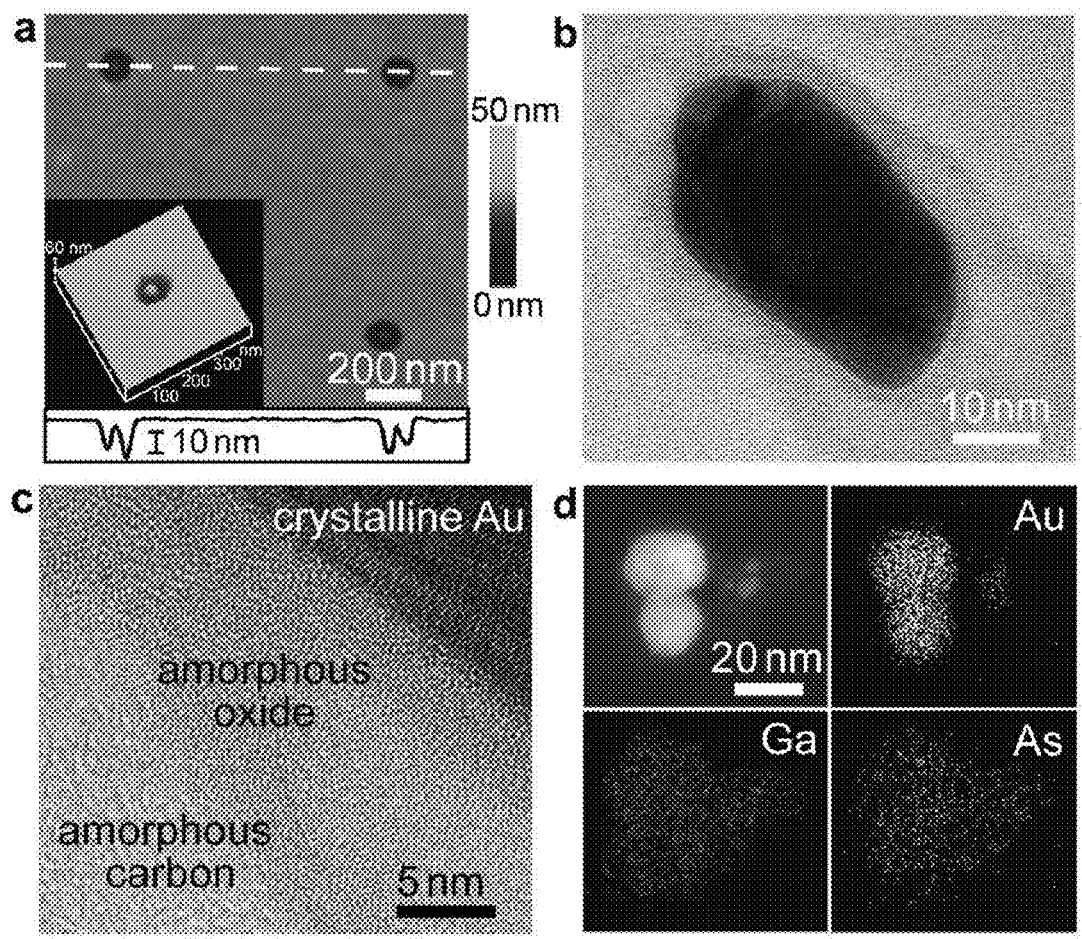

FIG. 3A is an AFM image and height profile of the patterned dot array. Inset is the corresponding 3D AFM image. FIG. 3B if a bright-field TEM image of an Au nanoparticle removed from patterned substrate. FIG. 3C is a high-resolution TEM image at the boundary of the particle showing three distinct structural regions. FIG. 3D is a dark-field STEM image and corresponding elemental mapping of Au nanoparticles, indicating spatial distribution of Au, Ga, and As.

Figure 4:
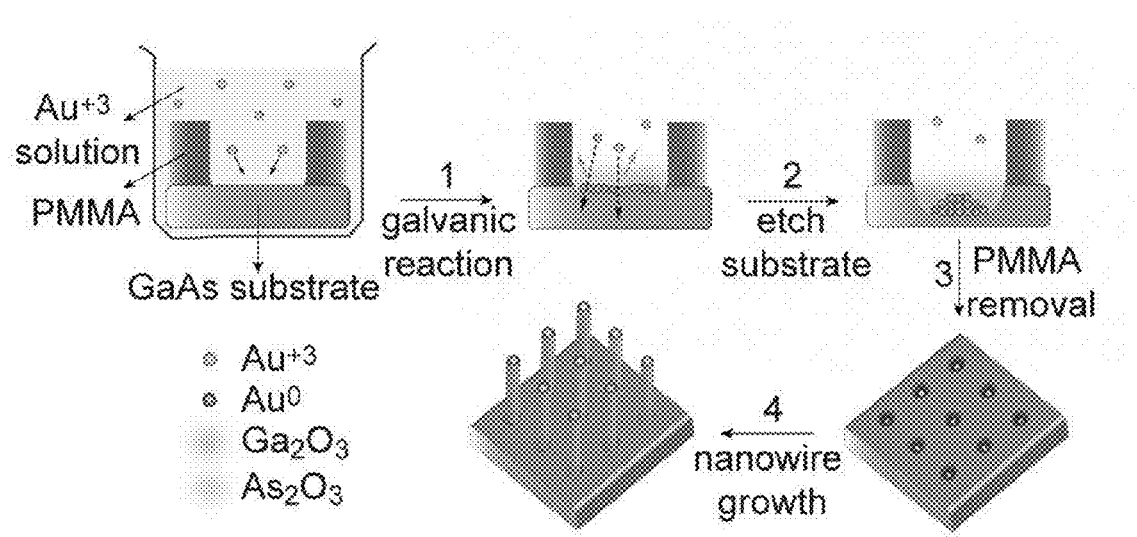

FIG. 4 is a schematic illustration of the growth mechanism of Au nanoparticles during the galvanic reaction and their consequent use as a template for epitaxial nanowire growth.

Figure 5:
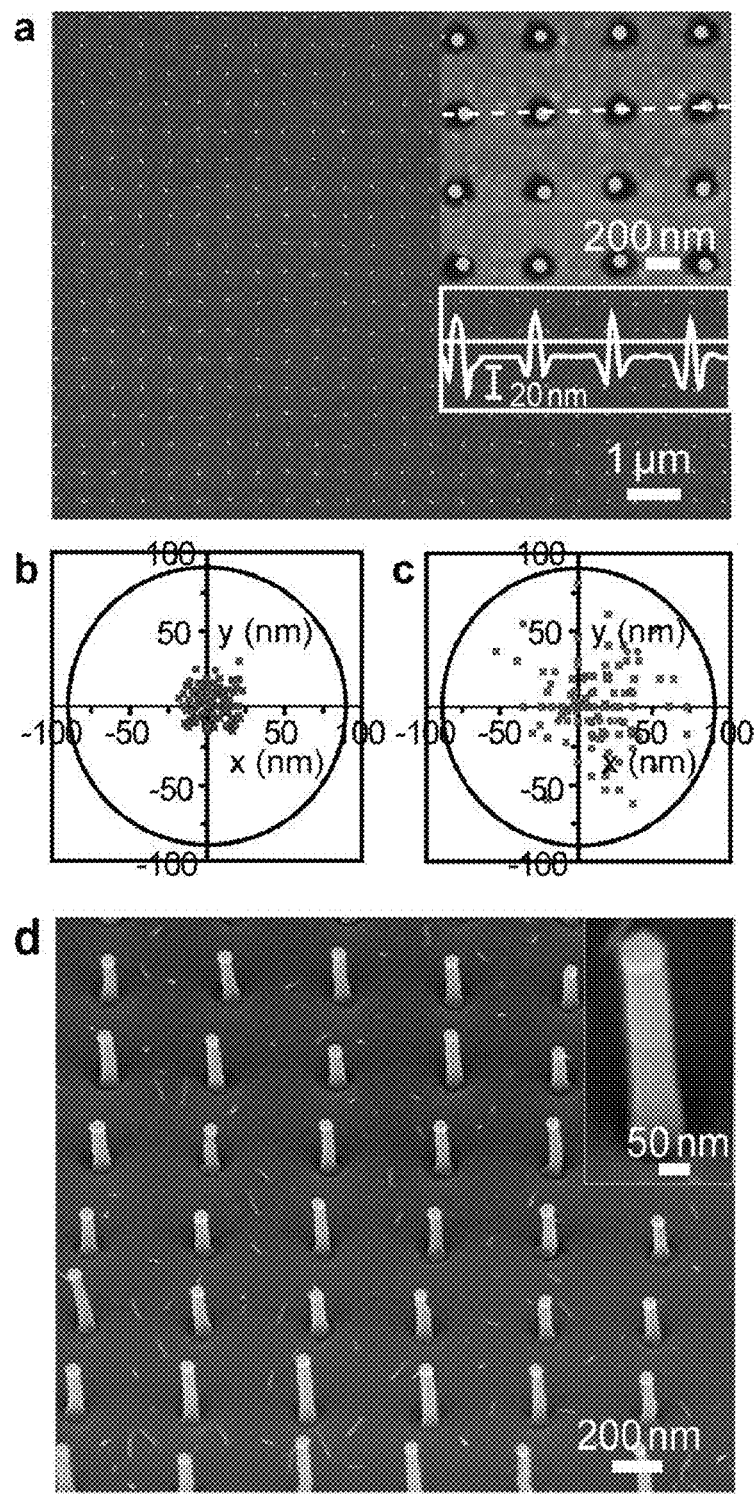

FIG. 5A is a SEM image of a dot array after the high temperature annealing process. Insets are the corresponding AFM image and height profile showing the Au particles remained inside the pits during the annealing process. FIG. 5B is a superimposed plot showing the position of Au nanoparticles before the annealing treatment from their EBL-defined position ((x,y)=0). FIG. 5C is a superimposed plot showing the position of Au nanoparticles after the annealing treatment from their EBL-defined position ((x,y)=0). FIG. 5D is a SEM image of GaAs nanowires directly grown from as-prepared substrate. Inset is a magnified SEM image of an individual nanowire showing the nanowires grew epitaxially from the pits.

Figure 6:
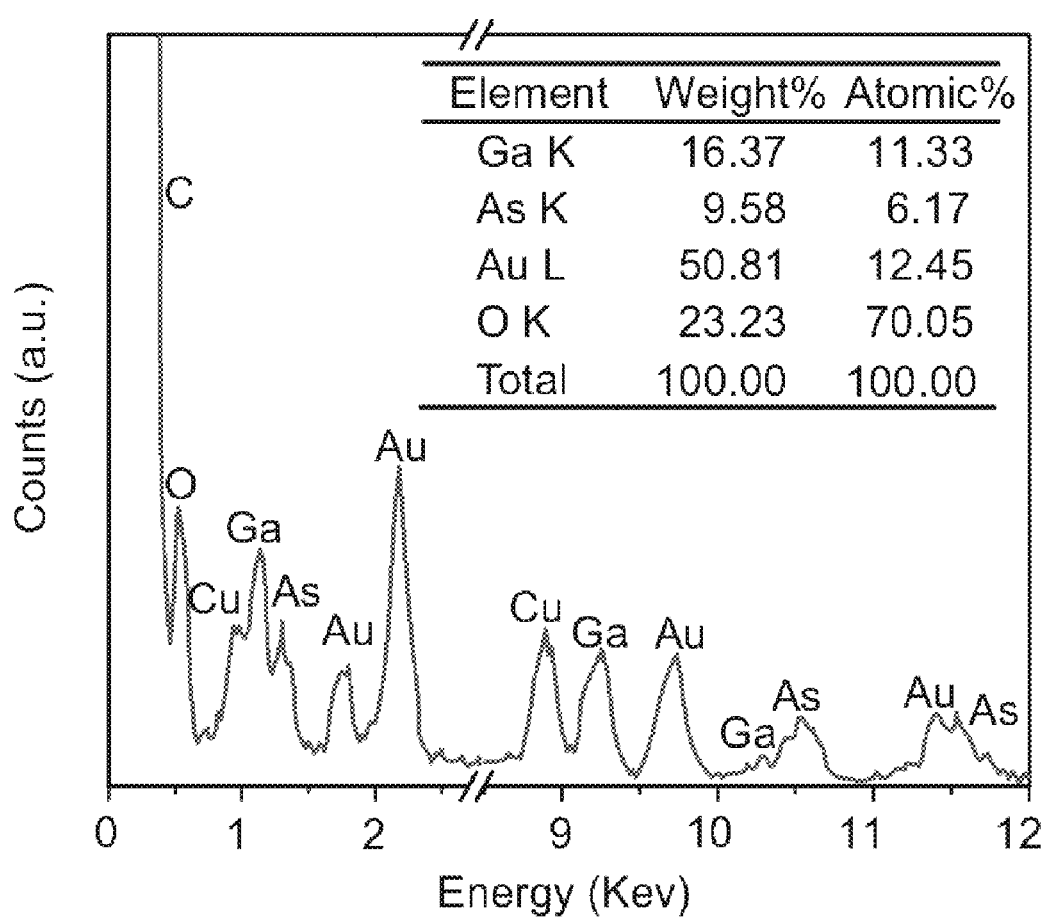

FIG. 6 is an EDS spectra of the nanoparticle shown in FIG. 3B which indicates the layer around Au nanoparticles is mainly comprised of Ga, As, and O (the C and Cu signals observed in EDS spectra originate from the carbon-coated TEM copper grid). The inset is the quantitative EDS analysis showing that the elemental concentration of the Ga is higher than that of As demonstrating the oxide surrounding the Au nanoparticle is Ga-rich.

Figure 7:
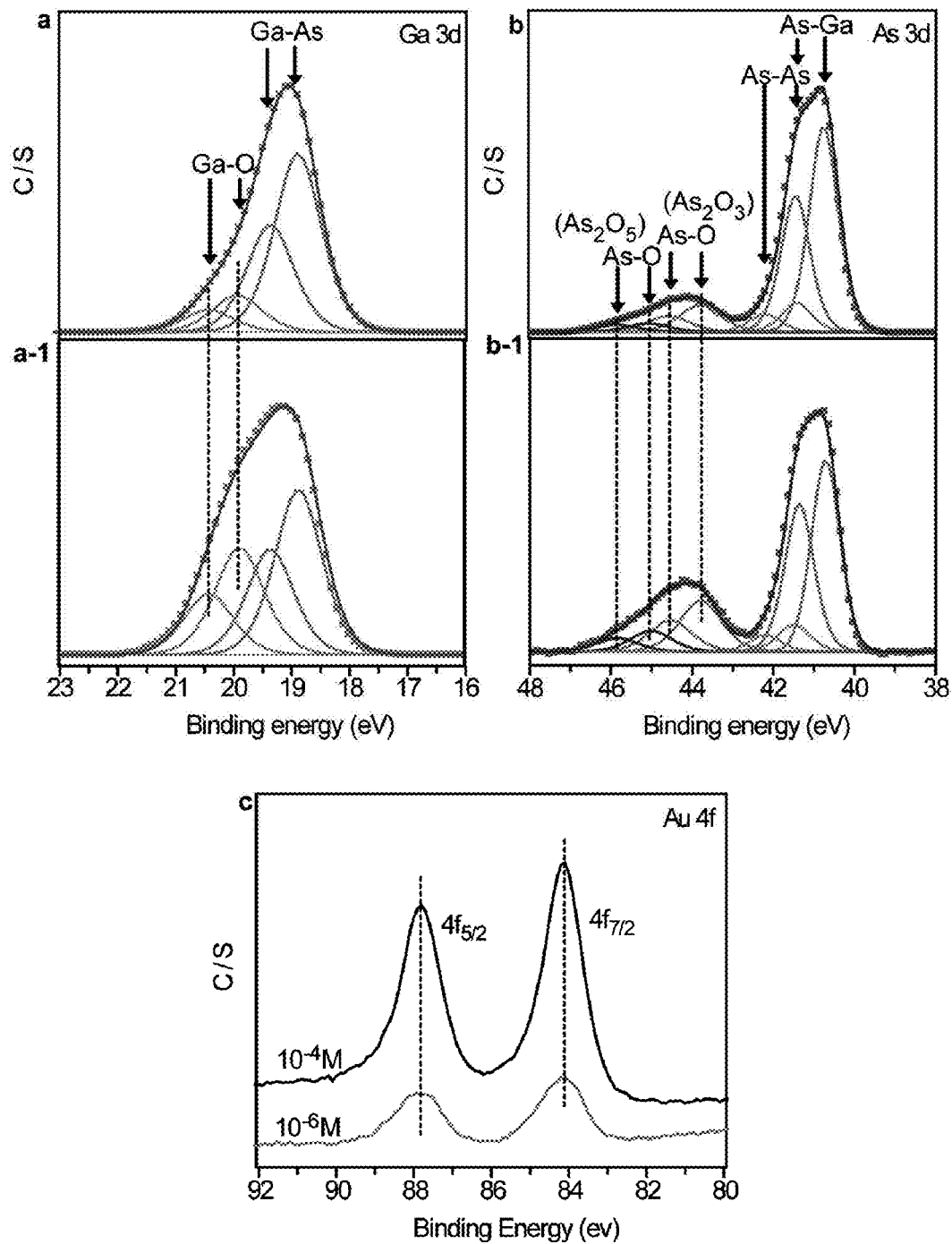

FIG. 7A is the Ga 3d XPS core level spectra of the GaAs substrate followed by applying the galvanic reaction with the $Au^{3+}$ reaction concentration of $10^{-6}$ M (top) and $10^{-4}$ M (bottom). FIG. 7B is the As 3d XPS core level spectra of the GaAs substrate followed by applying the galvanic reaction with the $Au^{3+}$ reaction concentration of $10^{-6}$ M (top) and $10^{-4}$ M (bottom). FIG. 7C is the Au 4f spectrum.

Figure 8:
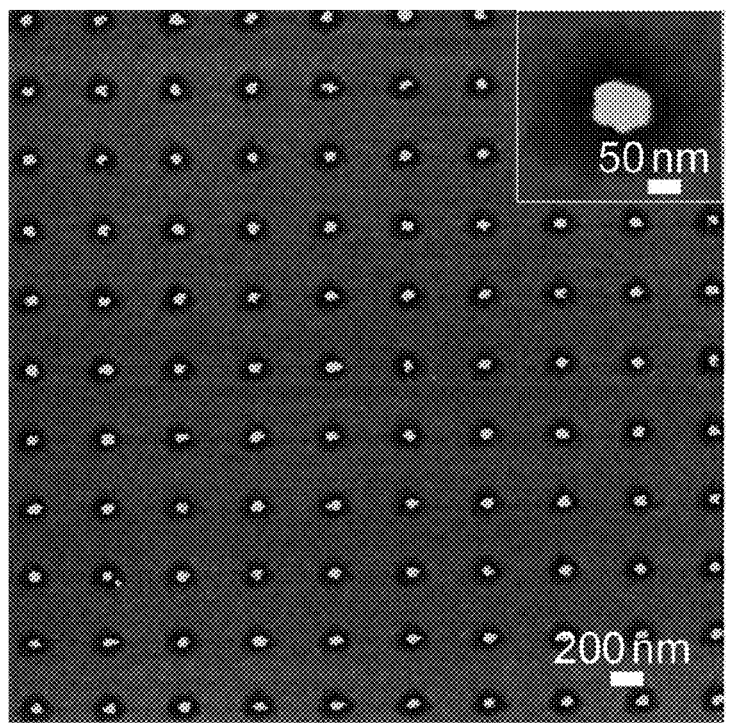

FIG. 8 is an AFM image of the dot array after the galvanic reaction (before the annealing process). The inset shows an individual Au nanoparticle inside an etched pit.

Figure 9:
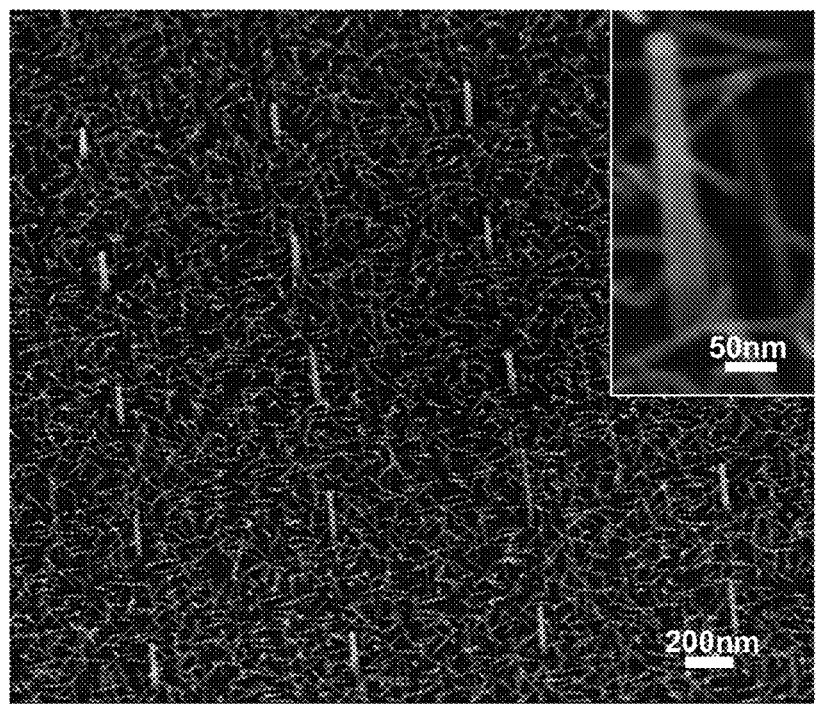

FIG. 9 is an SEM image of the GaAs nanowire array with a diameter around 20 nm.

DETAILED DESCRIPTION

Semiconductor nanowires, quazi one-dimensional single crystals composed of elemental or compound semiconductors, are promising material system for applications in electronics and photonics and variety of proof of concept nanowire devices have been demonstrated, including transistors. light-emitting diode (LEDs), lasers, and photovoltaic components. See, for example, Cui, Y., Duan, X., Hu, J. & Lieber, C. M., Doping and electrical transport in silicon nanowires. *J. Phys. Chem. B* 104, 5213-5216 (2000); Bryllert, T., Wernersson, L. E., Fröberg, L. E. & Samuelson, L., Vertical high-mobility wrap-gated InAs nanowire transistor. *IEEE Electron Device Lett.* 27, 323-325 (2006); Li, Y. et al., Dopant-free GaN/AlN/AlGaN radial nanowire heterostructures as high electron mobility transistors. *Nano Lett.* 6, 1468-1473 (2006); Duan, X. F., Huang, Y., Cui, Y., Wang, J. F. & Lieber, C. M., Indium phosphide nanowires as building blocks for nanoscale electronic and optoelectronic devices. *Nature* 409, 66-69 (2001); Qian, F. et al., Gallium nitride-based nanowire radial heterostructures for nanophotonics. *Nano Letters* 4, 1975-1979 (2004); Qian, F., Gradecak, S., Li, Y., Wen, C. Y. & Lieber, C. M., Core/multishell nanowire heterostructures as multicolor, high-efficiency light-emitting diodes. *Nano Lett.* 5, 2287-2291 (2005); Huang, M. H. et al., Room-temperature ultraviolet nanowire nanolasers. *Science* 292, 1897-1899 (2001); Duan, X., Huang, Y., Agarwal, R. & Lieber, C. M., Single-nanowire electrically driven lasers. *Nature* 421, 241-245 (2003); Gradecak, S., Qian, F., Li, Y., Park, H. G. & Lieber, C. M., GaN nanowire lasers with low lasing thresholds. *Applied Physics Letters* 87 (2005); Qian, F. et al., Multi-quantum-well nanowire heterostructures for wavelength-controlled lasers. *Nature Mater.* 7, 701-706 (2008); Law, M., Greene, L. O., Johnson, J. C., Saykally, R. & Yang, P., Nanowire dye-sensitized solar cells. *Nature Mater.* 4, 455-459 (2005); and Tian, B. et al., Coaxial silicon nanowires as solar cells and nanoelectronic power sources. *Nature*, 885-890 (2007), each of which is incorporated by reference in its entirety. The functionality of the nanowires can be influenced by control over nanowire properties—including size, position, or crystalline structure—on the nanometer scale.

A "wire" generally refers to any material having a conductivity of any semiconductor or any metal, and in some embodiments can connect two electronic components such that they are in electronic communication with each other. For example, the term "electrically conductive" or a "conductor" or an "electrical conductor" when used with reference to a "conducting" wire or a nanoscale wire, refers to the ability of that wire to pass charge. Preferred electrically conductive materials have a resistivity lower than about $10^{-3}$, more preferably lower than about $10^{-4}$, and most preferably lower than about $10^{-6}$ or $10^{-7}$ $\Omega$m.

A "nanoscopic wire" (also known herein as a "nanoscopic-scale wire" or "nanoscale wire" or simply "nanowire") generally is a wire, that at any point along its length, has at least one cross-sectional dimension and, in some embodiments, two orthogonal cross-sectional dimensions less than 1 μm, preferably less than about 500 nm, preferably less than about 200 nm, more preferably less than about 150 nm, still more preferably less than about 100 nm, even more preferably less than about 70, still more preferably less than about 50 nm, even more preferably less than about 20 nm, still more preferably less than about 10 nm, and even less than about 5 nm. In other embodiments, the cross-sectional dimension can be less than 2 nm or 1 nm. The nanoscale wire can have at least one cross-sectional dimension ranging from 0.5 nm to 200 nm. Where nanoscale wires are described having, for example, a core and an outer region, the above dimensions generally relate to those of the core. The cross-section of the elongated semiconductor may have any arbitrary shape, including, but not limited to, circular, square, rectangular, tubular, or elliptical, and may a regular or an irregular shape.

Exemplary materials for forming a nanowire include main group and metal atom-elements, transition metal-containing wires, gallium arsenide, gallium nitride, indium phosphide, germanium, cadmium selenide structures.

The nanowire can include an elemental semiconductor, such as Si, Ge, Sn, Se, Te, B, C (i.e., diamond), or P. The nanowire can include a solid solution of elemental semiconductors, such as B—C, B—P($BP_6$), B—Si, Si—C, Si—Ge, Si—Sn or Ge—Sn.

The nanowire can include a Group III-Group V semiconductor such as BN, BP, BAs, AN, AlP, AlAs, AlSb, GaN, GaP, GaAs, GaSb, InN, InP, InAs, or InSb. The nanowire can include an alloy of two or more Group III-Group V. The nanowire can include a Group II-Group VI semiconductor, such as ZnO, ZnS, ZnSe, ZnTe, CdS, CdSe, CdTe, HgS, HgSe, HgTe, BeS, BeSe, BeTe, MgS, or MgSe. The nanowire can include an alloy of two or more Group II-Group VI semiconductors. The nanowire can include an alloy of a Group II-Group VI semiconductor and a Group III-Group V semiconductor. The nanowire can include a Group IV-Group VI semiconductor, such as GeS, GeSe, GeTe, SnS, SnSe, SnTe, PbO, PbS, PbSe, or PbTe. The nanowire can include a Group I-Group VII semiconductor, such as CuF, CuCl, CuBr, CuI, AgF, AgCl, AgBr, or AgI. The nanowire can include a semiconductor such as $BeSiN_2$, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $Si_3N_4$, $Ge_3N_4$, $Al_2O_3$, $(Al, Ga, In)_2(S, Se, Te)_3$, or $Al_2CO$.

A wide variety of these and other nanoscale wires can be grown on and/or applied to surfaces in patterns useful for electronic devices. The nanoscale wires can be at least 1 μm, at least 3 μm, at least 5 μm, or at least 10 or 20 μm in length. The nanoscale wires can be less than about 100 nm, less than about 75 nm, less than about 50 nm, or less than about 25 nm in thickness (height and width). The wires can have an aspect ratio (length to thickness) of at least about 2:1, greater than about 10:1, or greater than about 1000:1. See, for example, U.S. Patent Application Publication No. 2003/0089899, which is incorporated by reference in its entirety.

One common method of nanowire synthesis is the vapor-liquid-solid (VLS) process that involves a seed particle. The seed particle acts as a catalyst, and defines the nanowire position and diameter. Gold (Au) nanoparticles are frequently used as catalysts for synthesis of nanowires of various compositions. Current methods of gold nanoparticle deposition are limited in control over nanoparticle size and/or position. See, for example, Nguyen, P., Ng, H. T. & Meyyappan, M., Catalyst metal selection for synthesis of inorganic nanowires. *Adv. Mater.* 17, 1773-1777 (2005), which is incorporated by reference in its entirety. For example, colloidal Au nanoparticles can be well controlled for size, but particle position is uncontrolled. The deposition process of colloidal Au nanoparticles can involve organic adhesion layers between the substrate and the Au nanoparticles, influencing the epitaxial growth and structural quality of the nanowires. See, for example, Cui, Y., Lauhon, L. J., Gudiksen, M. S., Wang, J. F. & Lieber, C. M., Diameter-controlled synthesis of single-crystal silicon nanowires. *Applied Physics Letters* 78, 2214-2216 (2001); and Mikkelsen, A. et al., The influence of lysine on InP(001) surface ordering and nanowire growth. *Nanotechnology* 16, 2354-2359 (2005), each of which is incorporated by reference in its entirety.

Positional control can be achieved for Au nanoparticles by first patterning the substrate using e-beam lithography (EBL) and subsequent Au deposition using physical vapor deposition (PVD). In this method, poor adhesion of Au to the growth substrate can interfere with the deposition of small diameter Au islands. See, for example, Mårtensson, T., Borgström, M., Seifert, W., Ohlsson, B. J. & Samuelson, L., Fabrication of individually seeded nanowire arrays by vapour-liquid-solid growth. *Nanotechnology* 14, 1255-1258 (2003), which is incorporated by reference in its entirety. Maintaining control over the nanoparticle positions can be difficult, because significant Au diffusion on the semiconductor substrates may occur during the annealing process. The diffusion may be especially troublesome for small Au particles. See, for example, Kraus, T. et al., Nanoparticle printing with single-particle resolution. *Nature Nanotech.* 2, 570-576 (2007); and Schmid, H. et al., Patterned epitaxial vapor-liquid-solid growth of silicon nanowires on Si(111) using silane. *Journal of Applied Physics* 103, 024304(024301-024307) (2008), each of which is incorporated by reference in its entirety.

Selectively synthesis of catalytic nanoparticles with controllable diameter, shape, and position can therefore be desirable for development of nanowire technology and broaden future applications of metal nanostructures. See, for example, Kraus, T. et al., Nanoparticle printing with single-particle resolution. *Nature Nanotech.* 2, 570-576 (2007); Maier, S. A. et al., Plasmonics—a route to nanoscale optical devices. *Adv. Mater.* 13, 1501-1505 (2001); and Liao, J., Bernard, L., Langer, M., Schonenberger, C. & Calame, M., Reversible formation of molecular junctions in 2D nanoparticle arrays. *Adv. Mater.* 18, 2444-2447 (2006), each of which in incorporated by reference in its entirety.

Figure 2:
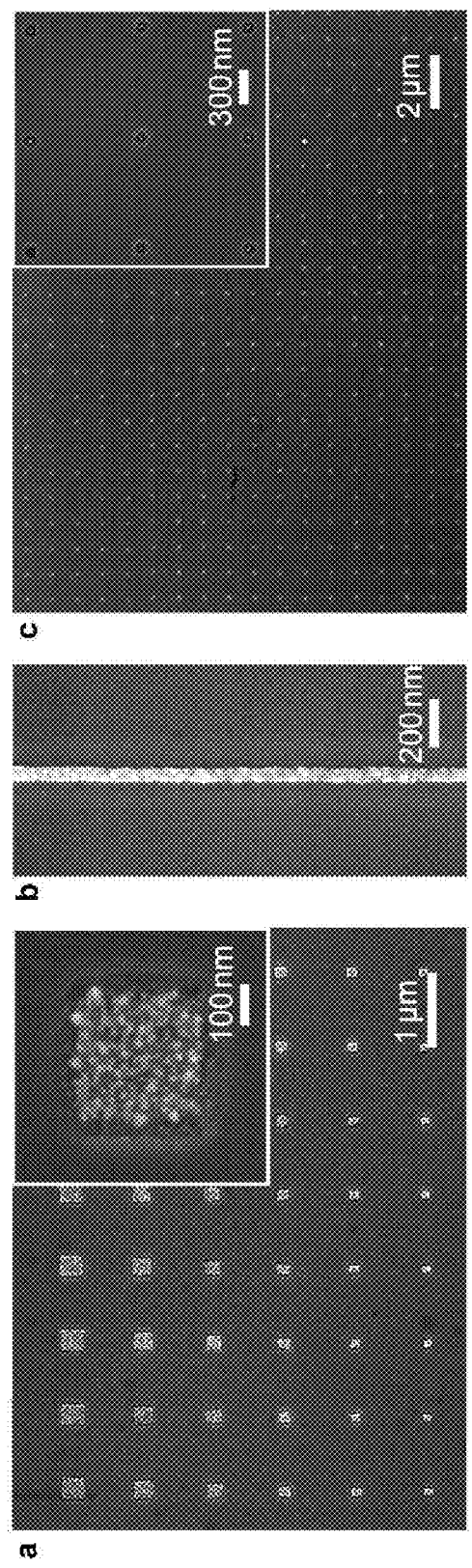
FIG. 2A is a SEM image of an array of squares of decreasing size, ranging from $320 \times 320$ $nm^2$ to $80 \times 80$ $nm^2$ EBL-defined Au patterns produced using the galvanic reaction.
FIG. 2B is a SEM image of a line pattern with an average width of 70 nm and 10 μm length.
FIG. 2C is an SEM image of a large-scale dot array with an average diameter of ~25 nm.

A simple and efficient electrochemical reaction can selectively synthesize Au nanoparticles on GaAs substrates using a galvanic reaction. See, for example, Aizawa, M. & Buriak, J. M., Block copolymer-templated chemistry on Si, Ge, InP, and GaAs surfaces. *J. Am. Chem. Soc.* 127, 8932-8933 (2005); Nezhad, M. R. H., Aizawa, M., Porter, L. A., Ribbe, A. E. & Buriak, J. M., Synthesis and patterning of gold nanostructures on InP and GaAs via galvanic displacement. *Small* 1, 1076-1081 (2005); Gao, D. et al., Selective growth of Si nanowire arrays via galvanic displacement processes in water-in-oil microemulsions. *J. Am. Chem. Soc.* 127, 4574-4575 (2005); Sayed, S. Y., Daly, B. & Buriak, J. M., Characterization of the interface of gold and silver nanostructures on InP and GaAs synthesized via galvanic displacement. *J. Phys. Chem. C* 112, 12291-12298 (2008), each of which is incorporated by reference in its entirety. Metal nanoparticles can be selectively prepared at predetermined locations on a substrate by patterning the substrate prior to the galvanic reaction. Patterning can be carried out, for example, by selectively removing regions of a polymer coating on a substrate by EBL. The metal nanoparticles can catalyze the growth of semiconductor nanowires by metalorganic chemical vapor deposition (MOCVD) to provide vertical semiconductor nanowires at predetermined locations on a substrate. The predetermined locations can be chosen so as to form, for example, an ordered array, a line, or other shapes or patterns. The dimensions of the shapes or patterns can be of any size attainable by EBL; for example, a dimension of 1 nm or less, 5 nm or less, 10 nm or less, 25 nm or less, or a larger dimension. As one example, FIGS. 2B and 2C show that the pattern can have features of less than 100 nm in size (i.e., a line that is 70 nm wide, and spots with an average diameter of ~25 nm, respectively). This approach allows for the creation of ordered arrays of metal nanoparticles without the use of external reducing agents, organic solvents, or strong acids. Diffusion of metal nanoparticles at high temperature annealing steps can be limited by the local environment surrounding the nanoparticles. For example, confining the galvanic reaction to a small region of exposed substrate can lead to spontaneous formation of pits surrounding each nanoparticle. The pits can retain the nanoparticles at temperatures used for annealing, thereby preventing diffusion of the metal nanoparticles.

EXAMPLES

Au nanoparticles on bare, non-patterned GaAs substrates were first synthesized using a galvanic reaction. A GaAs substrate was immersed in an $Au^{+3}$ solution (as $HAuCl_4$) to initiate the galvanic reaction. The $Au^{+3}$ solutions were prepared by dissolving hydrogen tetrachloroaurate(III) trihydrate (Alfa Aesar Co.) into deionized water. Prior to the galvanic reaction, all the GaAs substrates were immersed in a 2% (v/v) aqueous hydrofluoric acid (HF) solution for 5 min to remove the native oxide layer. For unpatterned samples, cleaned GaAs [100]B substrates were rinsed with deionized (DI) water and dried with a $N_2$ flow. Then, the cleaned substrates were immersed in the $Au^{+3}$ solution with different reaction concentrations ($10^{-4}$, $10^{-5}$, $5\times10^{-5}$ and $10^{-6}$ M) to start the galvanic reaction. For patterned samples, the patterned GaAs [111]B substrates patterned using EBL were immersed in $Au^{+3}$ solution of $5\times10^{-5}$ for 20 min. The $Au^{+3}$ ions diffused to the surface of the GaAs substrate due to the concentration equilibrium effect. Once the $Au^{+3}$ ions contacted the surface directly, a spontaneous reduction occurred due to the difference in the standard reduction potential (the $Au^{+3}/Au$ pair, 1.42 V versus a normal hydrogen electrode (NHE) is higher than those of $Ga^{+3}/Ga$, −0.56 V versus NHE, and the $As^{+3}/As$ pairs, 0.234 V versus NHE). See, for example, Sun, Y. G. & Wiederrecht, G. P., Surfactantless synthesis of silver nanoplates and their application in SERS. *Small* 3, 1964-1975 (2007), which is incorporated by reference in its entirety. The $Au^{+3}$ ions accept electrons from the bonding electrons of the GaAs substrate (valence band) forming Au nanoparticles and producing gallium and arsenic oxide on the surface of the GaAs substrate. See, for example, Oskam, G., Long, J. G., Natarajan, A. & Searson, P. C., Electrochemical deposition of metals onto silicon. *Journal of Physics D-Applied Physics* 31, 1927-1949 (1998), which has been incorporated by reference in its entirety. After the reaction, all the samples were thoroughly washed by DI water to remove the residual $Au^{+3}$ ions.

Figure 1:
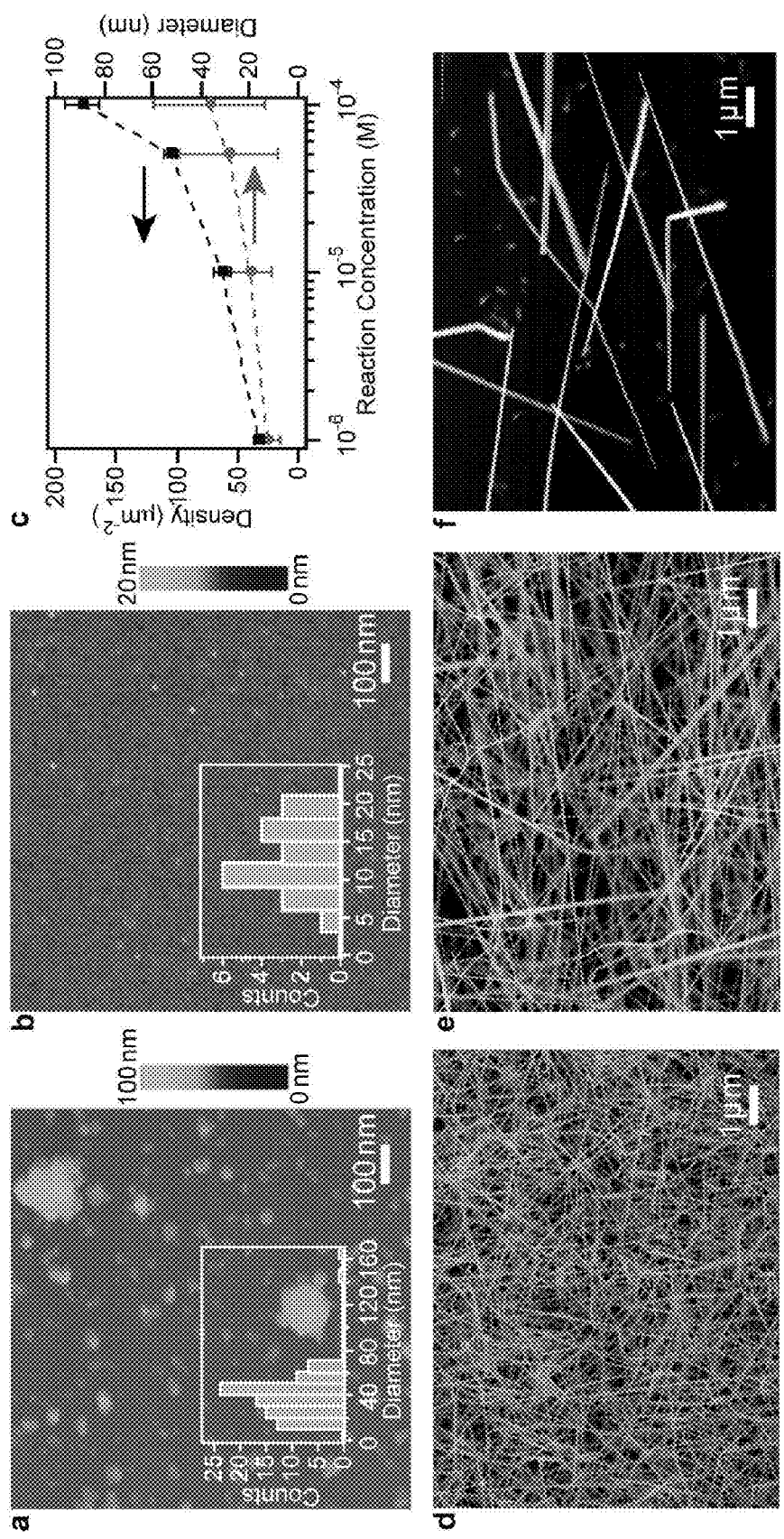
FIG. 1A is an AFM image and diameter distribution of the Au nanoparticles with the $Au^{+3}$ reaction concentration of $10^{-4}$ M.
FIG. 1B is an AFM image and diameter distribution of the Au nanoparticles with the $Au^{+3}$ reaction concentration of $5 \times 10^{-5}$ M.
FIG. 1C is a graph depicting nanoparticle diameter and spatial density as a function of the $Au^{+3}$ reaction concentration.
FIG. 1D is an SEM image of GaAs nanowires grown from galvanically-prepared Au nanoparticles when the $Au^{+3}$ was $10^{-4}$M and the reaction time was 10 min.
FIG. 1E is an SEM image of GaAs nanowires grown from galvanically-prepared Au nanoparticles when the $Au^{+3}$ was $10^{-4}$M and the reaction time was 5 min.
FIG. 1F is an SEM image of GaAs nanowires grown from galvanically-prepared Au nanoparticles when the $Au^{+3}$ was $10^{-4}$M and the reaction time was 1 min.

The influence of the $Au^{+3}$ ion concentration and the reaction time was investigated. FIGS. 1A and 1B show atomic force microscopy (AFM) images of Au nanoparticles on a GaAs substrate prepared at $Au^{+3}$ reaction concentrations of $10^{-4}$ M and $5\times10^{-5}$ M, respectively. Reaction time was fixed at 5 min. FIG. 1C shows that both the diameter and spatial density of the Au nanoparticles decrease with the decreasing $Au^{+3}$ reaction concentration. The mean particle diameters decrease from 37±23 nm to 13±5 nm and the density decreases from 178 $\mu m^{-2}$ to 33 $\mu m^{-2}$ as the $Au^{+3}$ concentration changes from $10^{-4}$ M to $10^{-6}$ M. Next, Au nanoparticles were deposited at a constant $Au^{+3}$ reaction concentration of $10^{-4}$ M with reaction times of 10 min, 5 min, and 1 min and were further used for the nanowire growth. FIGS. 1D, 1E, and 1F are SEM images of GaAs nanowires grown from galvanically-prepared Au nanoparticles when the $Au^{+3}$ was $10^{-4}$M and the reaction times were 10 min, 5 min, and 1 min, respectively. The SEM images show that Au particles prepared using this technique were successfully used as catalysts for GaAs nanowire growth. FIGS. 1D-1F further demonstrate that the density distribution of the nanowires (determined by the average catalyst density of Au nanoparticles) clearly decreases with reaction time. Thus, the diameter and density of the Au nanoparticles can easily be controlled by changing the reaction time and concentrations during the galvanic reaction.

While the galvanic process by itself provides some level of size and density control, the positions of the Au nanoparticles on the substrate are uncontrolled. To provide positional control, predefined regions of PMMA-covered GaAs substrates were exposed using EBL to form an array of square openings with varying sizes from 80×80 $\mu m^2$ to 320×320 $\mu m^2$. See FIGS. 2A-2C.

The samples for the electron-beam lithography were prepared by first dispersing 950K-PMMA on the GaAs(111)B substrate by spin coating and baking on a 180° C. hotplate for 3 min before EBL exposure. The thickness of the coated PMMA was about 50 nm as measured by a profilometer. All samples were exposed on a Raith-150 scanning EBL system at an accelerating voltage of 30 keV with a dot dose of 0.04 pAs/cm. The exposed PMMA was developed in a 2:1 isopropanol:methylisobutylketone (IPA:MIBK) solution for 90 s at 21° C. and further rinsed in the IPA solution for another 30 s. The lift-off process was performed by immersing the samples in a 1,2-dichloroethane (DCE) solution followed by $O_2$ plasma ashing. See, for example, Hang, Q. L., Hill, D. A. & Bernstein, G. H., Efficient removers for poly(methylmethacrylate). *Journal of Vacuum Science & Technology B* 21, 91-97 (2003), which is incorporated by reference in its entirety.

FIG. 2A shows that the galvanic reaction proceeded only on the exposed substrate regions, while it was inhibited on the PMMA-covered areas. Accordingly, Au nanoparticle growth followed the designed pattern. Within each square feature were many small Au nanoparticles with diameters in the range of 10-20 nm (FIG. 2A, inset), indicating that the growth of Au nanoparticles on the patterned sites started from small nuclei and then conformed to the EBL-defined area. This approach was also successfully applied to the fabrication of a line pattern. FIG. 2B shows a Au line having a width of 70 nm and length of 10 μm demonstrating the potential to create high quality patterns of Au with controlled sizes and specific shapes using the galvanic method. FIG. 2C shows a large-scale array of Au nanoparticles with an average diameter of ~25 nm and spacing of 1 μm. The array was produced using EBL and the galvanic process with a growth yield close to 100% over a 100×100 $\mu m^2$ area. The results indicated that as-grown Au nanoparticles have a strong bonding force to the GaAs substrate, and are not influenced by the removal of the e-beam resist, unlike PVD-produced Au films. Significantly, no adhesion agent was necessary and Au nanoparticles with a small diameter distribution grew uniformly and tightly on the patterned GaAs substrate.

FIG. 2C further indicated the presence of a dark region surrounding each Au particle that could be caused by chemical or morphological modifications. FIG. 3A shows AFM images which characterized the detailed surface morphology of patterned Au arrays. The AFM results showed that each Au nanoparticle resided inside an etched pit that was formed during the galvanic process. The average depth of the pits was 16.0 nm and average height of the Au nanoparticles was 11.4 nm. These dimensions revealed that the particles were embedded inside the pits, rather than protruding outward. Notably, no etched pits were observed for unpatterned substrates, implying that the patterning of the substrate significantly altered the deposition condition of the Au nanoparticles during the galvanic reaction. Since no separate etching step was involved in the deposition process, the observed pits were a consequence of the galvanic reaction. Transmission electron microscopy (TEM) and X-ray photoemission spectrometry (XPS) were used to characterize the Au nanoparticles and the surface of the GaAs substrates after the galvanic reaction. FIG. 3B shows a TEM image of an Au nanoparticle removed from EBL-defined substrate, indicating that the nanoparticle was covered by an amorphous layer. FIG. 3C shows a high-resolution TEM image recorded at the edge of the Au nanoparticle. Three distinguishing areas were observed in FIG. 3C: the crystalline Au nanoparticle, an amorphous layer surrounding it, and amorphous carbon from the TEM grid. FIG. 3D shows dark-field scanning TEM (STEM) revealing contrast indicative of variations in the chemical composition. Energy-dispersive x-ray spectroscopy (EDS) elemental mapping of the same region confirmed that Au was covered by a Ga- and As-containing layer. The quantitative EDS analysis showed that the layer around the nanoparticles was mainly composed of Ga, As, and oxygen with the elemental concentration of Ga higher than that of the As.

Finally, XPS investigation of the surface composition and chemical bonding states of the GaAs surface after galvanic reaction showed the compositions of the gallium and arsenic oxide were mainly composed of digallium trioxide ($Ga_2O_3$) and diarsenic trioxide ($As_2O_3$).

The EBL-defined galvanic Au arrays were used for MOCVD nanowire growth. Nanowires were grown by atmospheric-pressure MOCVD in a Thomas Swan CS62820 reactor with $H_2$ carrier gas flow of 15 SLPM (standard liters per minute). The samples were annealed at 600° C. for 10 min in arsine ($AsH_3$) flow. GaAs nanowire growth was initiated by reducing the temperature to 420° C., then introducing trimethyl gallium (TMG). During the growth, TMG and $AsH_3$ flows were held constant at 0.31 and 6.7 SCCM (standard cubic centimeter per minute), respectively, for 12 min. SEM images were obtained using JEOL 6320FV high-resolution scanning electron microscope with an accelerating voltage of 5 kV. High-resolution lattice image and composition analysis were characterized by JEOL 2010F field-emission transmission electron microscope (FE-TEM) equipped with EDS. For STEM bright-field and annular dark-field imaging, a VG HB603 FE STEM was used operating at 250 kV. Kratos Axis Ultra Imaging XPS with a monochromatized Al Kα X-ray source (1486 eV) and giving an experimental resolution of 0.5 eV was used to characterize the surface chemical bonding state. The graphite (C1s peak, 285.2 eV) was used for calibration. Atomic force microscopy (AFM) studies were carried out using a Nanoscope IV (Digital Instruments) in the tapping mode under ambient conditions using silicon cantilever tips (radius of curvature ranging between 5 and 10 nm).

FIG. 5A shows SEM and AFM images of the particle array after the annealing process. Almost all of the Au nanoparticles remained in their initial position over a 50×50 μm² area. The etched pits created through the galvanic reaction successfully prevented the Au nanoparticle diffusion during the high temperature anneal. Quantitative analysis of AFM images before the annealing step showed that the average size of Au nanoparticles was 76±5 nm and they were formed in the middle of the etched pits with an average size of 200±9 nm. FIG. 5B is a superimposed plot showing the position of Au nanoparticles before the annealing treatment from their EBL-defined position ((x,y)=0). Most of the nanowires (~95%) were located within 25 nm from their EBL-defined origin. During the annealing process the nanoparticles remained confined with the corresponding pits, but small diffusion within the pit was possible. FIG. 5C is a superimposed plot showing the position of Au nanoparticles after the annealing treatment from their EBL-defined position ((x,y)=0). The majority of nanoparticles were located within 60 nm from their EBL-defined origin.

FIG. 5D shows an SEM image of the epitaxial GaAs nanowires growth from the as-prepared substrate. The Au nanoparticles synthesized by EBL galvanic reaction can directly function as catalytic seeds for epitaxial nanowire growth. The diameter of nanowire followed the Au nanoparticle size and the nanowires were grown restrictedly from the created pits, preserving the EBL-defined pattern. This method was further applied to fabricate nanowire arrays with diameters as small as 20 nm. The obtained results showed that the galvanic reaction produced nanowire arrays with various diameter ranges (from 20 nm to hundreds of nanometers).

Galvanic reactions have been previously used for synthesis of metal nanoparticles, thin films, metal and semiconductor nanowires, but no precise position control or etching phenomenon on the substrates has been reported to date. See, for example, Aizawa, M. & Buriak, J. M., Block copolymer-templated chemistry on Si, Ge, InP, and GaAs surfaces. *J. Am. Chem. Soc.* 127, 8932-8933 (2005); Nezhad, M. R. H., Aizawa, M., Porter, L. A., Ribbe, A. E. & Buriak, J. M., Synthesis and patterning of gold nanostructures on InP and GaAs via galvanic displacement. *Small* 1, 1076-1081 (2005); Gao, D. et al., Selective growth of Si nanowire arrays via galvanic displacement processes in water-in-oil microemulsions. *J. Am. Chem. Soc.* 127, 4574-4575 (2005); Magagnin, L., Maboudian, R. & Carraro, C., Selective deposition of thin copper films onto silicon with improved adhesion. *Electrochem. Solid-State Lett.* 4, C5-C7 (2001), each of which is incorporated by reference in its entirety. Formation of etch pits during the particle synthesis, observed on EBL-defined surfaces but not unpatterned surfaces, indicated the substrate material was locally consumed during the galvanic reaction. During this process, $Au^{+3}$ accepted electrons from the GaAs substrate and initiated the growth of Au particles, accompanied by the formation of the $Ga_2O_3$ and $As_2O_3$ around the Au nanoparticles, as described in equation (1):

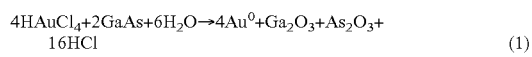

$$4HAuCl_4 + 2GaAs + 6H_2O \rightarrow 4Au^0 + Ga_2O_3 + As_2O_3 + 16HCl \qquad (1)$$

The resulting $Ga_2O_3$ was insoluble in aqueous solutions with pH value between 6 and 7 and was only water soluble with the presence of strong acid or base. See, for example, Song, Y. Y., Gao, Z. D., Kelly, J. J. & Xia, X. H., Galvanic deposition of nanostructured noble-metal films on silicon. *Electrochemical and Solid State Letters* 8, C148-C150 (2005); and Aizawa, M. & Buriak, J. M., Block copolymer templated chemistry for the formation of metallic nanoparticle arrays on semiconductor surfaces. *Chemistry of Materials* 19, 5090-5101 (2007), each of which is incorporated by reference in its entirety. Some HCl was produced during the reaction (equation (1)), but the pH value of the solution remained around 6 due to the very low concentrations of $HAuCl_4$ that were used (from $10^{-4}$ M to $10^{-6}$ M) for the reaction. $As_2O_3$, however, is easily soluble in water:

$$As_2O_3 + 3H_2O \rightarrow 2H_2AsO_3^- + 2H^+ \qquad (2)$$

See, for example, Song, J. S. et al., Wet chemical cleaning process of GaAs substrate for ready-to-use. *Journal of Crystal Growth* 264, 98-103 (2004), which is incorporated by reference in its entirety.

Therefore, most of the subsequent oxide accompanied by the growth of Au nanoparticles on the surface of GaAs substrate was Ga-rich oxide ($Ga_2O_3$), as confirmed by XPS. The dissolution of $As_2O_3$ kept the reaction proceeding and continuously consumed the Ga and As from the surface of GaAs substrate. On the unpatterned substrates, the process proceeded at any location on the surface with abundant Ga and As supply, and no significant variation in the morphology of the substrate was produced. However, on the patterned substrate, the supply of Ga and As was restricted to the exposed areas of the substrate, resulting in the formation of etched pit around the Au nanoparticles (depicted as step 1 to 3 in FIG. 4). The overall reaction ceased when a layer of $Ga_2O_3$ formed, covering the surface of the GaAs substrate and the Au nanoparticles. The oxide layer halted electrons transfer and prevented $Au^{+3}$ ions in the solution from contacting the pristine GaAs surface to continue the reaction. The substrate etching effect became significant when sufficient metal ions were supplied on a limited area and the produced oxides were efficiently dissolved to keep the reaction proceeding on the semiconductor substrate. Therefore, the combination of EBL and the galvanic process made a unique route to synthesize catalytic Au nanoparticles with well-defined size and position.

These as-grown Au nanoparticles directly function as catalytic seeds for GaAs nanowire growth. Results obtained from SEM images showed the versatility of applying galvanic reaction to fabricate high quality Au patterns without any adhesive layers. Moreover, for the patterned substrates, the in situ created pits surrounded the Au nanoparticles during the galvanic reaction helped to stabilize the nanoparticles throughout the high temperature annealing. This technique can enable fabrication of uniform ordered arrays of vertical GaAs nanowires. The method described here can be further extended to other metal systems used as nanowire catalysts, such as silver (Ag), copper (Cu) and nickel (Ni), as well as other substrates such as silicon, sapphire, or GaN to simplify the future fabrication procedures of nanowire devices. By combining other lithographic or self-assembly techniques with the galvanic process, ordered arrays of robust metal nanostructures could be achieved for applications in nano-plasmonics or molecular electronics.

Other embodiments are within the scope of the following claims.

What is claimed is:

1. A composition comprising a plurality of nanowires each epitaxially grown from a nanoparticle on a surface of a semiconductor substrate, wherein the plurality of nanowires have a predetermined diameter and a predetermined position, wherein the plurality of nanowires are separated from another nanowire on the semiconductor substrate by a barrier including a portion of the semiconductor substrate that is raised relative to the region of the semiconductor substrate upon which the nanowire is positioned,
   wherein the nanoparticle is positioned in a pit in a surface of the semiconductor substrate, the pits having sidewalls that form in the surface of the semiconductor substrate.

2. The composition of claim 1, further comprising a polymeric material.

3. The composition of claim 1, wherein the substrate is GaAs.

4. The composition of claim 2, wherein the polymeric material is PMMA.

5. The composition of claim 1, wherein the nanowire is a GaAs nanowire.

6. The composition of claim 1, wherein the nanoparticle is an Au nanoparticle.

7. The composition of claim 1, wherein the average diameter of the nanowire is 25 nm or smaller, or 10 nm or smaller.

8. A nanomaterial comprising:
   a nanowire epitaxially grown from a nanoparticle on a surface of a semiconductor substrate;
   an amorphous layer surrounding the nanoparticle; and
   a barrier, wherein the barrier is a portion of the semiconductor substrate that is raised relative to the region of the semiconductor substrate upon which the nanowire is positioned,
   wherein the nanoparticle is positioned in a pit in a surface of the semiconductor substrate, the pits having sidewalls that form in the surface of the semiconductor substrate.

9. The nanomaterial of claim 8, wherein the nanoparticle is a nanocrystal.

10. The nanomaterial of claim 8, wherein the nanoparticle is an Au nanoparticle.

11. The nanomaterial of claim 8, wherein the nanowire is a GaAs nanowire.

12. The nanomaterial of claim 8, wherein the average diameter of the nanowire is 25 nm or smaller, or 10 nm or smaller.

13. The nanomaterial of claim 8, wherein the amorphous layer comprises an oxide.

14. The nanomaterial of claim 13, wherein the amorphous layer includes an oxide derived from the substrate.

* * * * *